(12) United States Patent
Matsumura (10) Patent No.: US 11,131,716 B2
(45) Date of Patent: Sep. 28, 2021

(54) SYSTEMS, METHODS AND DEVICES FOR BATTERY CHARGE STATE DETECTION

(71) Applicant: INTEL CORPORATION, Santa Clara, CA (US)

(72) Inventor: Naoki Matsumura, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 892 days.

(21) Appl. No.: 15/190,759

(22) Filed: Jun. 23, 2016

(65) Prior Publication Data

US 2017/0370999 A1 Dec. 28, 2017

(51) Int. Cl.
*G01R 31/389* (2019.01)
*G01R 31/3842* (2019.01)
*G01R 31/378* (2019.01)
*G01R 31/36* (2020.01)
*G01R 31/367* (2019.01)

(52) U.S. Cl.
CPC ....... *G01R 31/389* (2019.01); *G01R 31/3648* (2013.01); *G01R 31/378* (2019.01); *G01R 31/3842* (2019.01); *G01R 31/367* (2019.01)

(58) Field of Classification Search
CPC ........ H01M 2/00; H01M 2200/00; H02J 1/00; G06K 1/00; G06K 2207/00; G06N 3/00
See application file for complete search history.

(56) References Cited

U.S. PATENT DOCUMENTS

| | | | |
|---|---|---|---|
| 2006/0109008 A1 | 5/2006 | Emori et al. | |
| 2008/0174269 A1 | 7/2008 | Derome et al. | |
| 2009/0053594 A1 | 2/2009 | Johnson et al. | |
| 2009/0061292 A1* | 3/2009 | Inagaki | H01M 4/485 429/90 |
| 2010/0201320 A1* | 8/2010 | Coe | H01M 10/44 320/129 |
| 2010/0261048 A1* | 10/2010 | Kim | B60L 58/12 429/150 |
| 2012/0303208 A1* | 11/2012 | Hariharan | H01M 10/48 701/32.9 |

(Continued)

FOREIGN PATENT DOCUMENTS

| | | |
|---|---|---|
| CN | 101409376 | 4/2009 |
| CN | 102859378 | 2/2011 |

(Continued)

OTHER PUBLICATIONS

PCT/US2017/034189, International Search Report and Written Opinion, dated Jul. 21, 2017, 13 pages.
International Preliminary Report on Patentability notified Jan. 3, 2019 for PCT Patent Application No. PCT/US2017/034189.
1st Office Action, notified Sep. 22, 2020, for Chinese Patent Application No. 201780032153.6.

(Continued)

*Primary Examiner* — Jermele M Hollington
*Assistant Examiner* — Temilade S Rhodes-Vivour
(74) *Attorney, Agent, or Firm* — Schwabe, Williamson & Wyatt, P.C.

(57) ABSTRACT

Estimating a charge state for a flat-voltage profile battery can be accomplished using impedance measurements. For example, an impedance measurement can be used to form a fuel gauge for a lithium-air (Li-Air) battery. As the impedance of a Li-Air battery increases during discharge, it corresponds to a state of charge (i.e., a charge state). The impedance can be used to create charge state data to use with a fuel gauge.

31 Claims, 9 Drawing Sheets

(56) References Cited

U.S. PATENT DOCUMENTS

| | | | | |
|---|---|---|---|---|
| 2013/0264999 A1* | 10/2013 | Srinivasan | ................ | H02J 7/00 |
| | | | | 320/107 |
| 2015/0338466 A1* | 11/2015 | Wu | ...................... | H02J 7/0021 |
| | | | | 320/126 |
| 2015/0367747 A1* | 12/2015 | Decker | ................ | H01M 10/44 |
| | | | | 320/136 |
| 2015/0372328 A1* | 12/2015 | Taruya | ............... | H01M 8/04111 |
| | | | | 320/102 |
| 2016/0012922 A1 | 1/2016 | Christensen et al. | | |
| 2016/0020618 A1* | 1/2016 | Yang | ...................... | H02J 7/045 |
| | | | | 320/162 |
| 2016/0274194 A1* | 9/2016 | Nelson | ................. | H02J 7/0021 |
| 2016/0336623 A1* | 11/2016 | Nayar | .................... | H01M 4/38 |
| 2017/0070061 A1* | 3/2017 | Barsukov | .............. | H02J 7/0077 |

FOREIGN PATENT DOCUMENTS

| | | |
|---|---|---|
| CN | 102798822 | 5/2012 |
| CN | 104345202 | 7/2014 |
| CN | 104820189 | 2/2015 |
| CN | 102066964 | 8/2015 |
| JP | 2010088167 | 9/2008 |
| WO | 2007006121 A1 | 1/2007 |
| WO | 2016012922 A1 | 1/2016 |

OTHER PUBLICATIONS

Second Office Action dated Jun. 3, 2021 for Chinese Patent Application No. 201780032153.6. No translation available.

* cited by examiner

SYSTEMS, METHODS AND DEVICES FOR BATTERY CHARGE STATE DETECTION

TECHNICAL FIELD

The present disclosure relates to batteries and more specifically to battery charge state detection.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Techniques, apparatus and methods are disclosed that enable estimating a charge state for a flat-voltage profile battery using impedance measurements. For example, an impedance measurement can be used to form a fuel gauge for a lithium-air (Li-Air) battery. As the impedance of a Li-Air battery increases during discharge, it corresponds to a state of charge (i.e., a charge state). The impedance can be used to create charge state data to use with a fuel gauge.

A battery fuel gauge monitors the remaining capacity and full-charge capacity mainly by the combination of two methods: (1) voltage detection and (2) coulomb counting. Voltage detection is a method to read the battery voltage under small or no current, and estimate the corresponding state of charge by following a curve or the reference table. Coulomb counting is a method to measure current flowing into or out of the battery. These methods compensate for the errors of each other and are used for a Li-Ion battery (e.g., Graphite-LiCoO2 battery).

A Li-Air battery is one of the next generation batteries that can provide more than a 60% higher energy density than a Li-Ion battery. However, since a voltage profile during discharge is stable, it is difficult to use voltage detection for a fuel gauge. Prior methods of coulomb counting can be used, but prior methods of using voltage measurements to compensate for the error of coulomb counting do not appear to work.

Instead of voltage, an impedance of a flat voltage battery (e.g., Li-Air battery) or partial flat voltage battery (e.g., Li-Metal battery) can be used to estimate a charge state for the flat voltage portion of the charge state. Unlike a Li-Ion battery (e.g., graphite-lithium cobalt oxide (LiCoO2) battery), the impedance of a Li-Air battery increases during discharge and corresponds to the state of charge. This measured impedance can be used for a fuel gauge.

Measuring impedance of the flat voltage battery to directly estimate charge state is different than impedance tracking used by other models. Impedance tracking is to measure open circuit voltage (OCV) accurately by considering IR drop (IR=I(current)×R(Resistance or Impedance)).

Charge state estimation can be additionally corrected by considering additional factors. For example, battery impedance may change by temperature. An embodiment may use a table or formula to compensate for the difference by temperature. Battery impedance may change when the battery is aged/cycled. An embodiment may compensate for the difference by measuring a difference of the impedance at the specific state of charge (e.g., 100%). The impedance difference at the specific state of charge (e.g., 100%) may be used as an indicator of "state of health" of the battery.

This process can be used for a fuel gauge of other batteries where a voltage profile is flat during charge or discharge but impedance changes corresponding to its state of charge. For example, a Zinc-Air battery uses zinc and oxygen to form zinc oxide. Since the standard Gibbs free energy of zinc, oxygen and zinc oxide are the same during charge or discharge, battery voltage derived from the difference of Gibbs free energy [G(ZnO)—G(Zn)—½G(O2)] is flat during charge or discharge. A Zinc-Air battery forms zinc oxide as a result of a zinc-oxygen reaction. As zinc oxide has lower electric conductivity than an electrode (e.g., carbon), an impedance increase is expected as a discharge cycle progresses.

Figure 1:
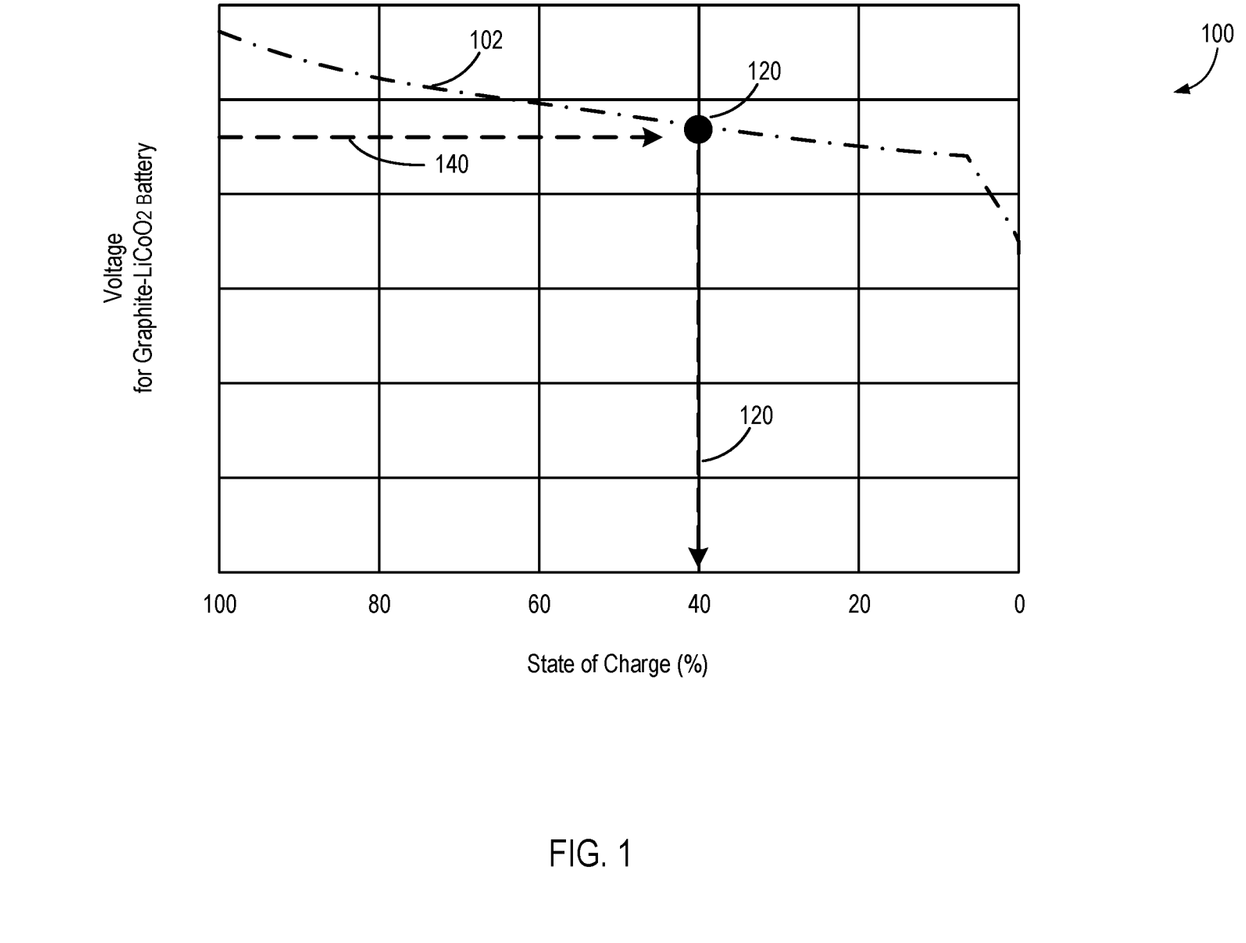
FIG. 1 is a graph illustrating a battery system having a decreasing voltage profile consistent with embodiments disclosed herein.

FIG. 1 is a graph illustrating a battery system having a decreasing voltage profile consistent with embodiments disclosed herein. The voltage profile of a Li-Ion battery (e.g., Graphite-LiCoO2 battery) in FIG. 1 has a non-flat voltage profile 102, in which voltage decreases as the battery discharges. The x-axis represents a charge state from 100% to 0% and the y-axis represents a voltage from low to high. When a battery has a non-flat voltage profile 102, the state of charge can be determined by using a voltage to identify a state of charge on a charge state graph 100. For example, a voltage 140 corresponds to a 40% charge state (120). This is represented by a point 120 on the graph.

Figure 2:
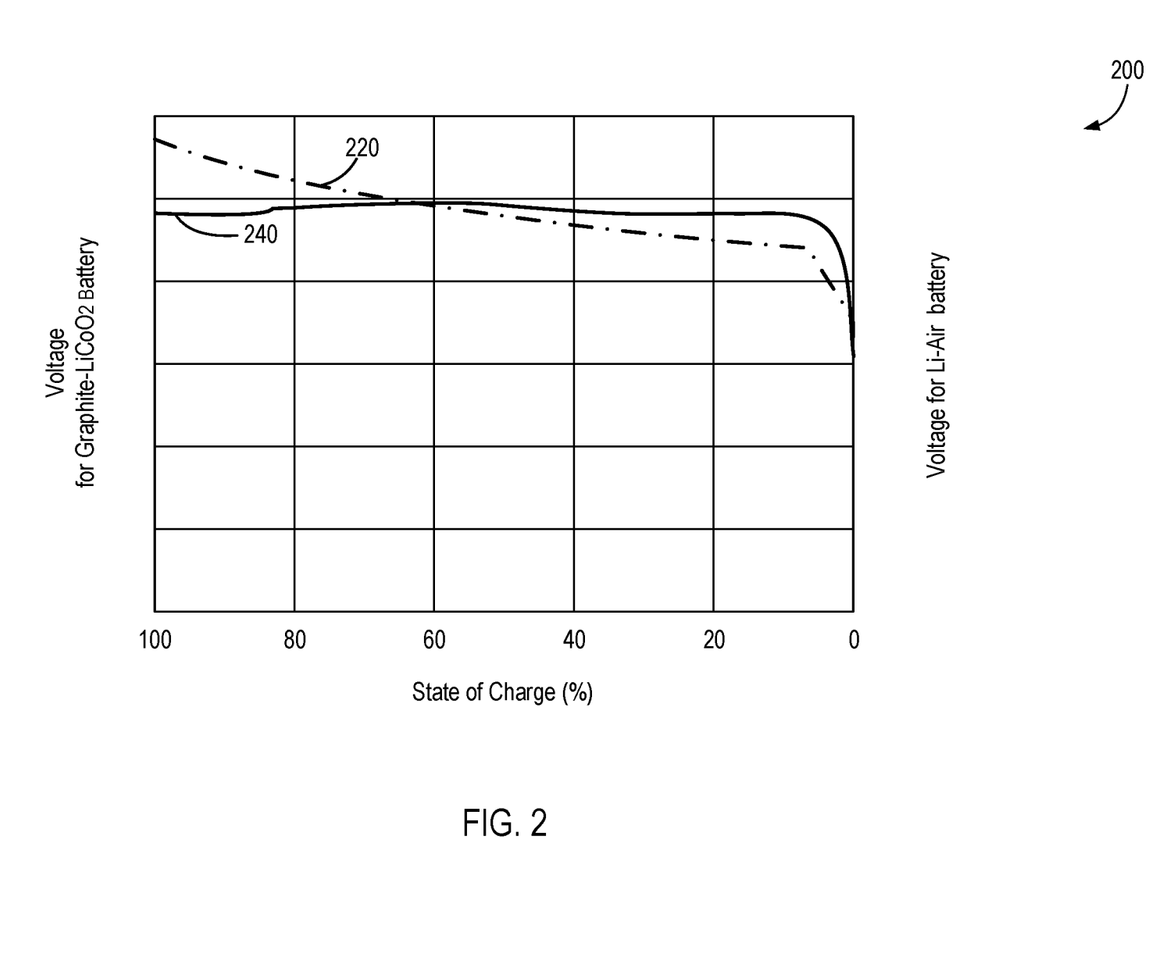
FIG. 2 is a graph illustrating a comparison between a battery system having a flat voltage profile and a decreasing voltage profile consistent with embodiments disclosed herein.

FIG. 2 is a graph illustrating a comparison between a battery system having a flat voltage profile 240 and a decreasing voltage profile 220 consistent with embodiments disclosed herein. The x-axis represents a charge state from 100% to 0% and the y-axis represents a voltage from low to high. While a charge state of a battery having a decreasing voltage profile 220 has a one-to-one correspondence between a voltage and a charge state, a battery having a flat voltage profile 240 does not. As shown, the flat voltage profile 240 of a Li-Air battery can have a plurality of states with a same or similar voltage. Therefore it can be difficult to determine a charge state of a Li-Air battery based on voltage. Coulomb counting can be used, but there is no method to compensate for the error of coulomb counting.

However, a charge state using a voltage profile 220 of a LiCoO2 battery can more easily be determined based on voltage. An example of that determination is shown in conjunction with FIG. 1.

Figure 3:
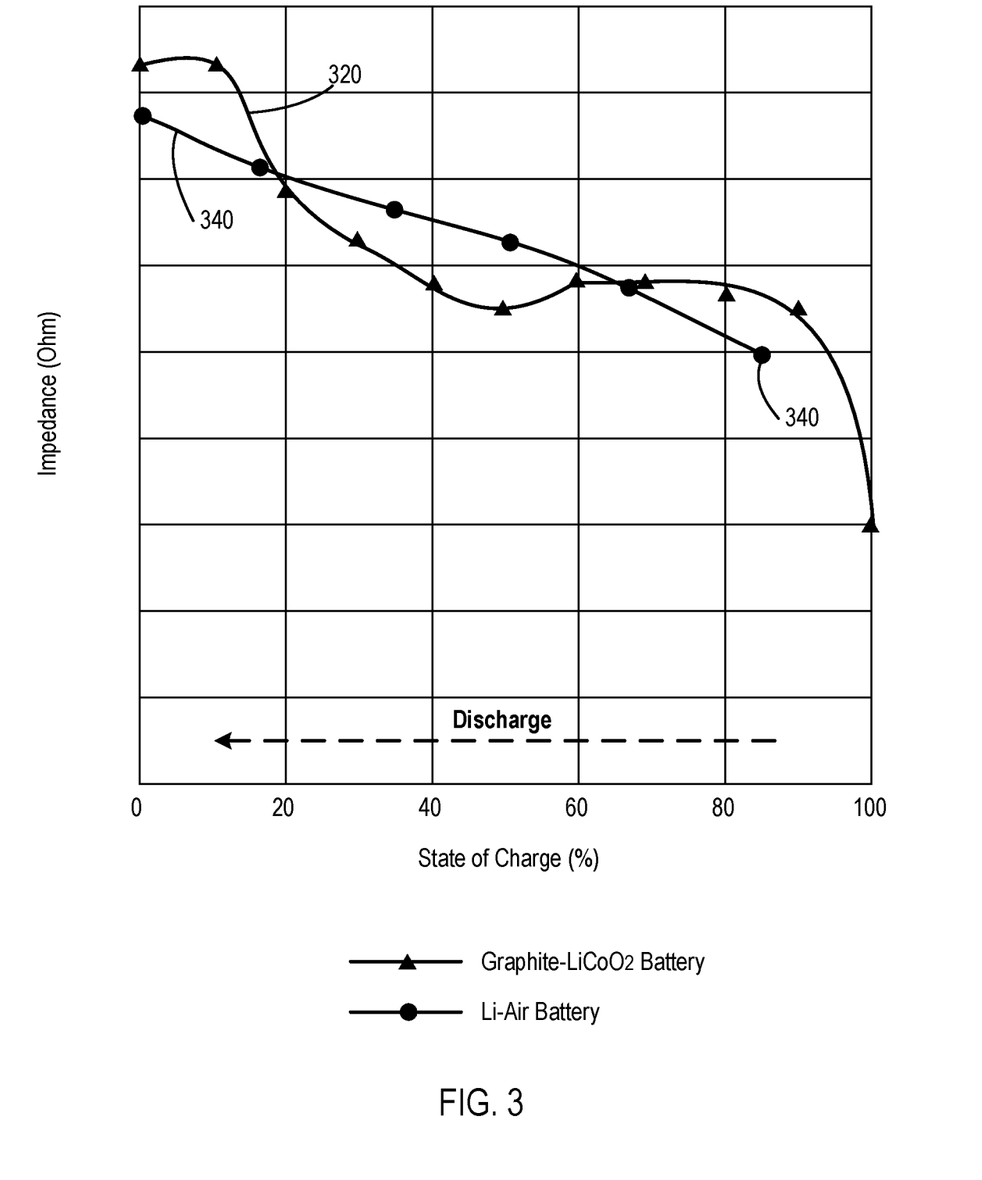
FIG. 3 is a graph illustrating a decreasing impedance profile of a battery system having a flat voltage profile and another battery system having a decreasing voltage profile consistent with embodiments disclosed herein.

FIG. 3 is a graph illustrating a decreasing impedance profile of a battery system having a flat voltage profile consistent with embodiments disclosed herein. With some flat voltage profile batteries, an impedance profile 340 can be used to estimate charge state. For example, an impedance profile 340 of a Li-Air battery can be used to determine a charge state of the battery. The Li-Air battery has a one-to-one correspondence (or approximately so) of charge state to impedance. As the Li-Air battery discharges, the impedance of the Li-Air battery increases. This correspondence can allow the impedance of the Li-Air battery (or other flat-voltage batteries) to be used for a fuel gauge. For other batteries, such as a Li-Ion battery, the impedance profile 320 can have a plurality of states with a same or similar impedance.

Figure 4:
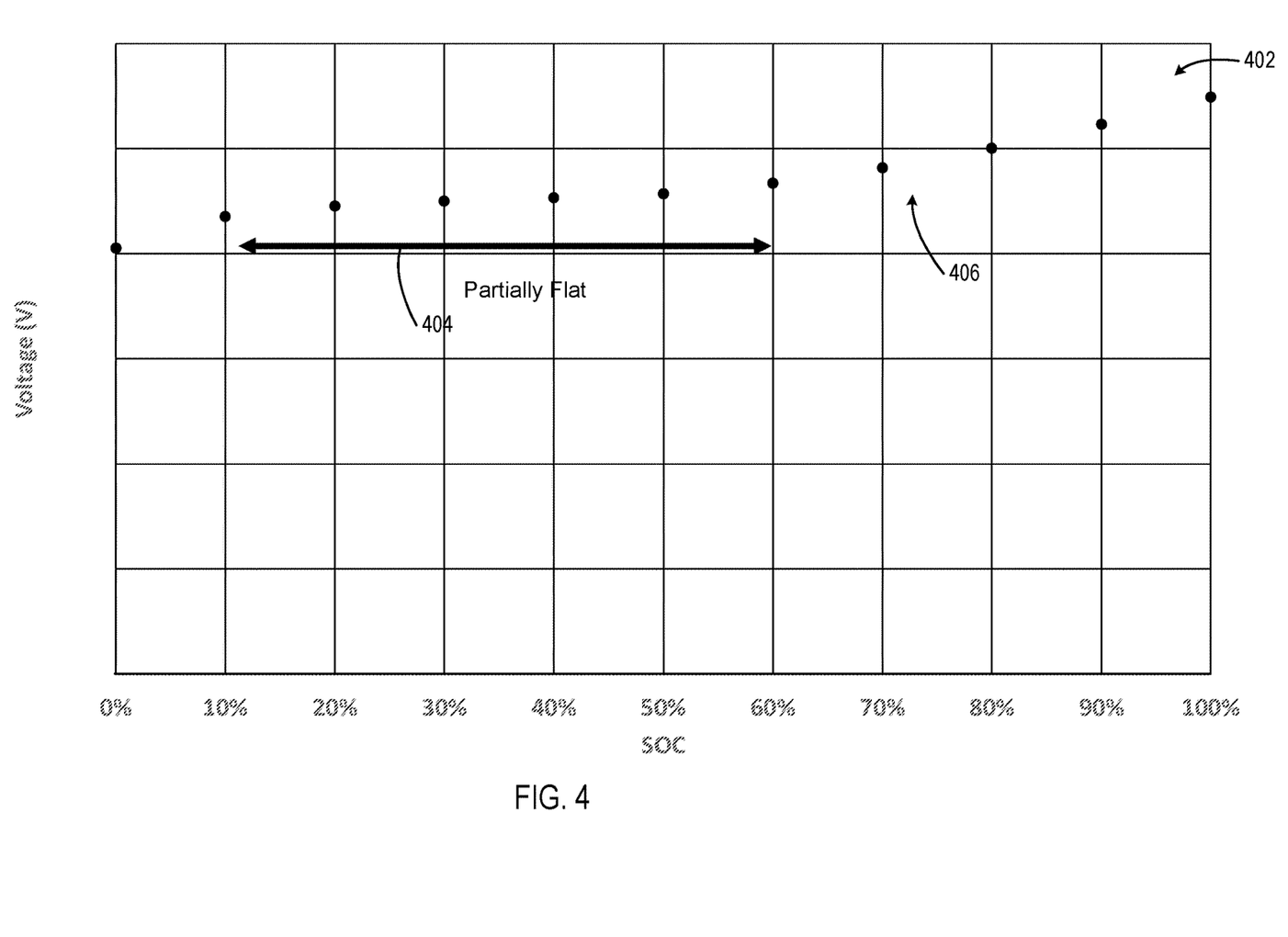
FIG. 4 is a graph illustrating a partially flat voltage profile of a battery system consistent with embodiments disclosed herein.
Figure 5:
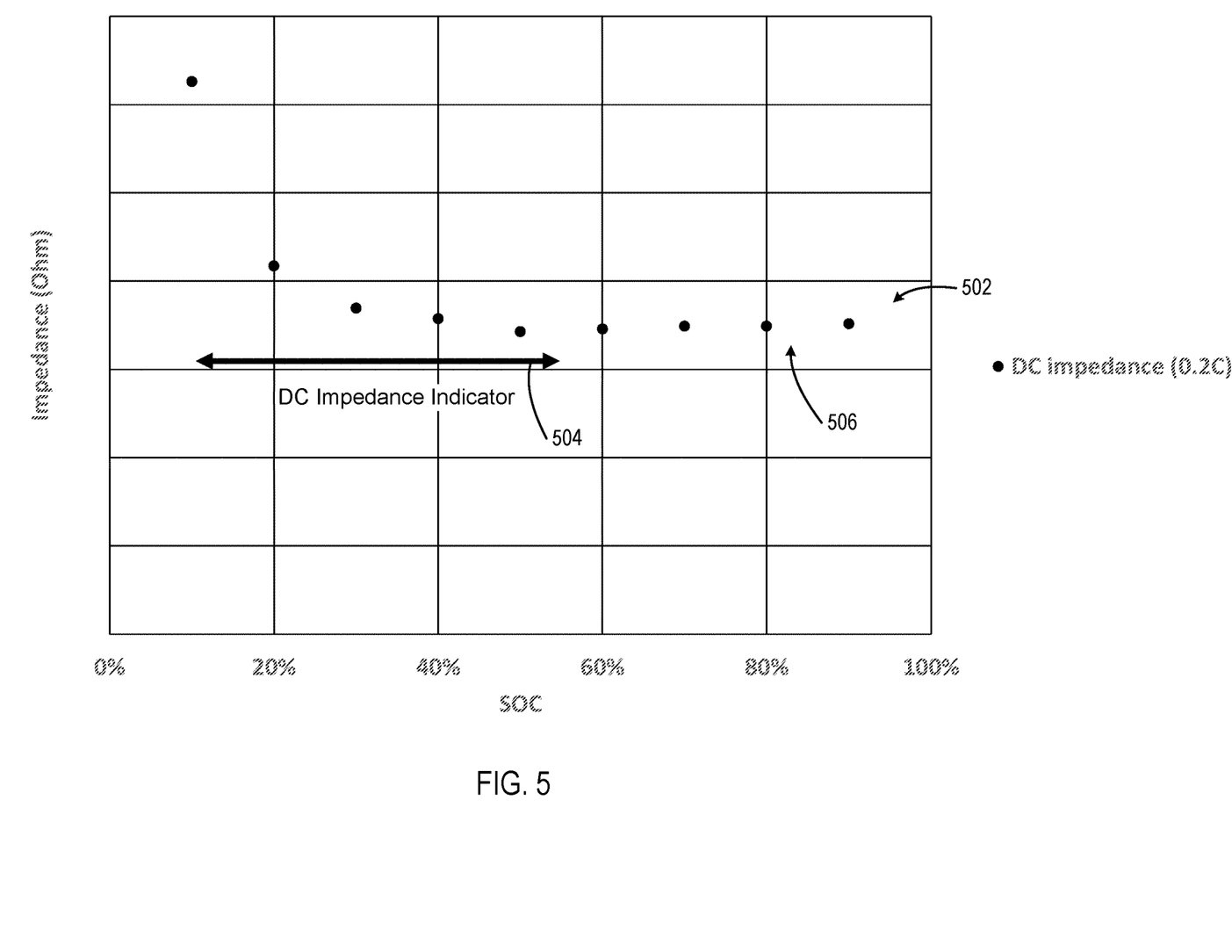
FIG. 5 is a graph illustrating an impedance profile of a battery system having a partially flat voltage profile consistent with embodiments disclosed herein.

FIGS. 4-5 show a voltage profile 402 and an impedance profile 502 of a battery that has a partially flat voltage profile. A fuel gauge system can use a voltage during a non-flat portion of the voltage profile and an impedance during a flat portion of the voltage profile to estimate a charge state.

FIG. 4 is a graph illustrating a partially flat voltage profile of a battery system consistent with embodiments disclosed herein. In some embodiments, a battery can have a partially flat voltage profile 402 having a flat portion 404 and a non-flat portion 406. For a non-flat portion 406, a voltage can be used to determine a charge state (i.e., state of charge or SOC). For a flat portion 404, an impedance can be used instead to estimate charge state. A fuel gauge system can use a threshold voltage or impedance to determine when to use voltage or impedance to estimate a charge state.

FIG. 5 is a graph illustrating an impedance profile of a battery system having a partially flat voltage profile consistent with embodiments disclosed herein. In some embodiments, a battery can have a partially flat impedance profile 502 having a flat portion 506 and a non-flat portion 504. For a non-flat portion 504, an impedance can be used to estimate charge state. For a flat portion 506, a voltage can be used instead to determine a charge state. A fuel gauge system can use a threshold voltage or impedance to determine when to use voltage or impedance to estimate a charge state.

Figure 6:
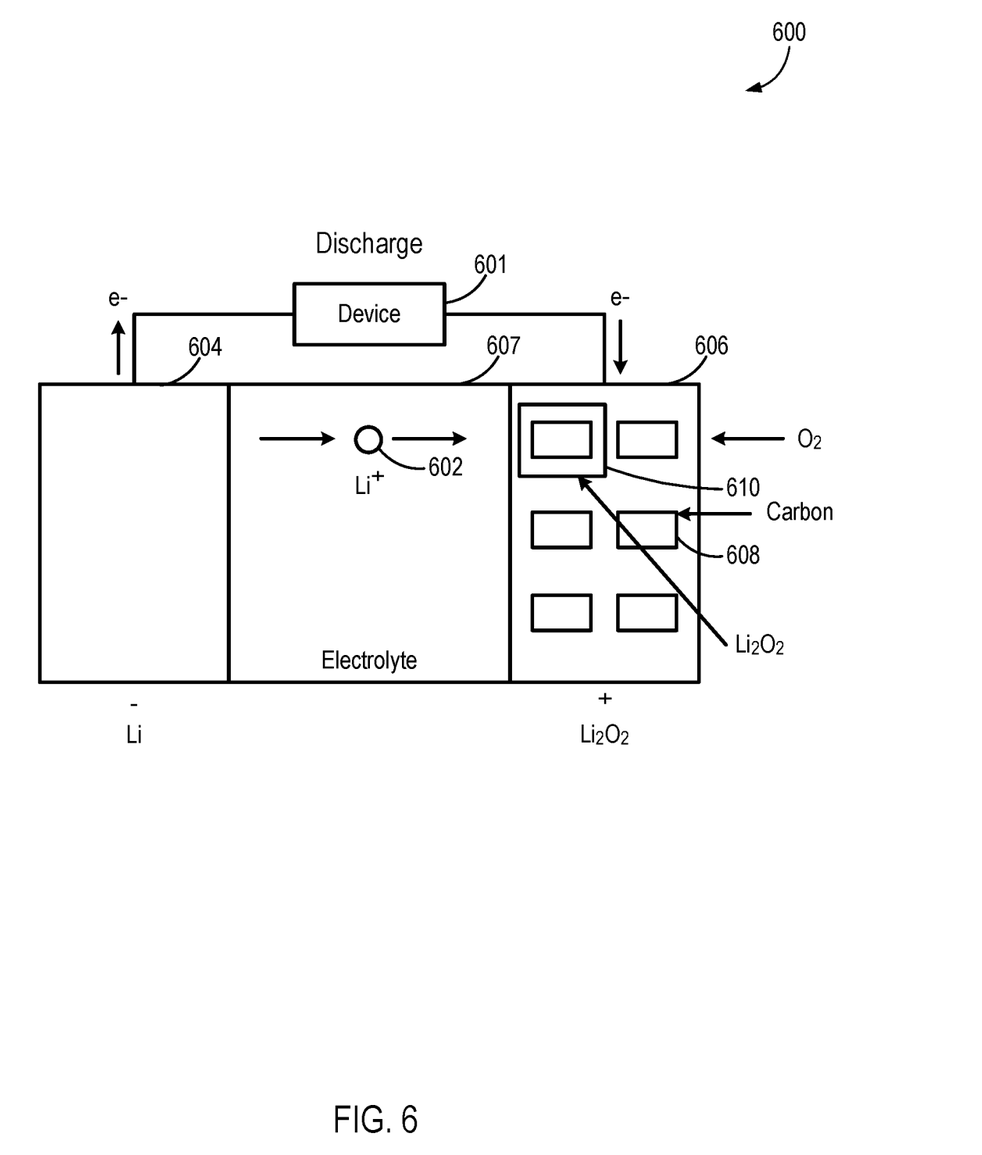
FIG. 6 is a schematic of a lithium-air (Li-Air) battery consistent with embodiments disclosed herein.

FIG. 6 is a schematic of a lithium-air (Li-Air) battery 600 consistent with embodiments disclosed herein. In the embodiment shown and during discharge (e.g., powering a device 601), Lithium (Li) 602 comes from a Li anode (−) 604 to a cathode side (+) 606 through electrolyte 607, and reacts with oxygen around a carbon electrode 608 to form Lithium peroxide (Li2O2) 610. As Li2O2 has lower electric conductivity than carbon, the more Li2O2 is formed around carbon during discharge, the higher impedance is measured.

Figure 7:
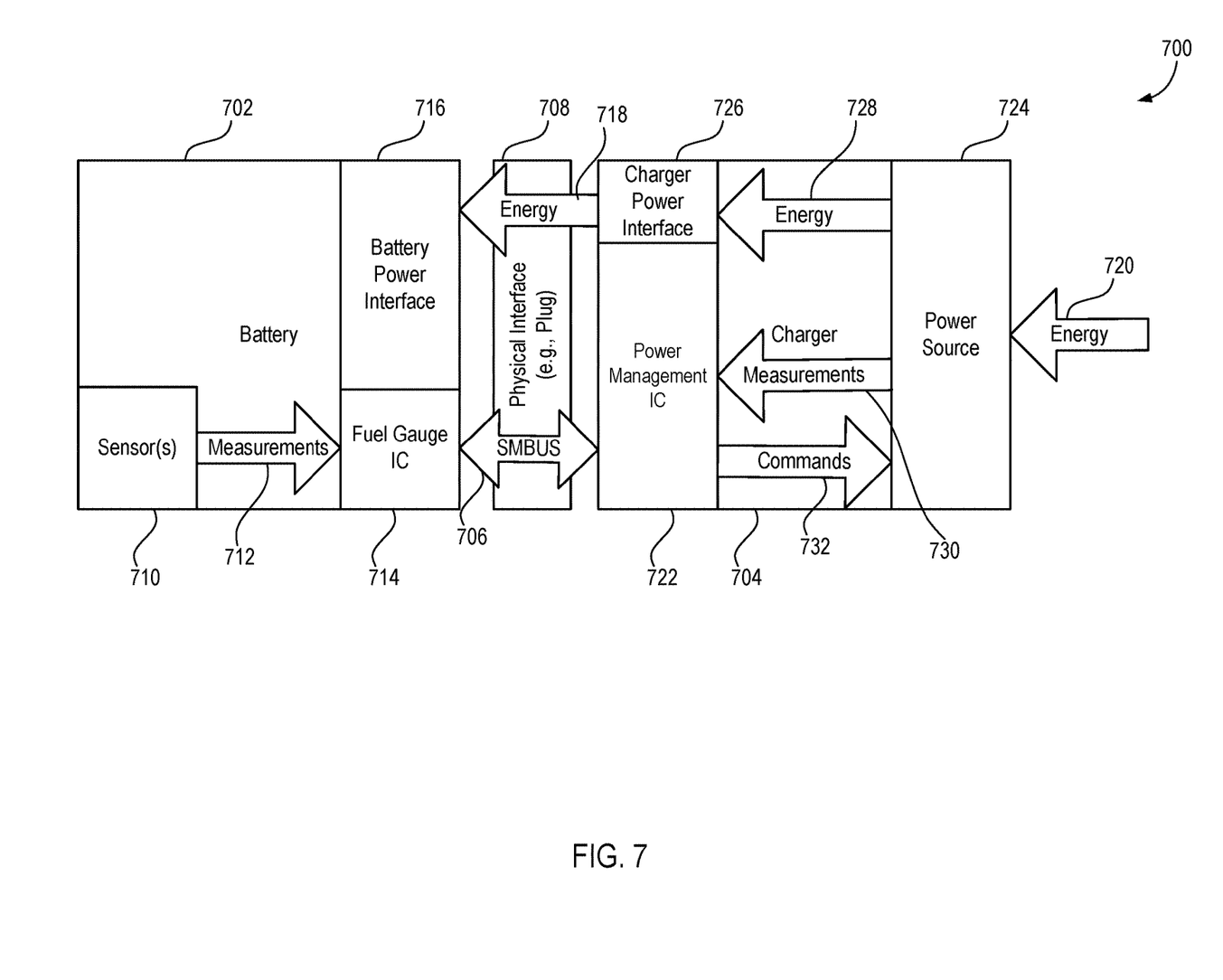
FIG. 7 is a diagram of a battery system consistent with embodiments disclosed herein.

FIG. 7 shows a diagram 700 of a battery 702 connected to a charger 704 through a physical interface 708 using a SMBUS 706 for communication. The battery 702 can include sensors 710, battery power interface 716 and battery controller 714. The sensors 710 can measure aspects of the battery 702, such as impedance, open circuit voltage (OCV), charge current, charge voltage, etc. The battery power interface 716 can receive energy 718 over the physical interface 708 from the charger 704 and provide the energy 718 to the battery 702. The battery power interface 716 can also include safety features that prevent damage to the battery 702 (e.g., overvoltage protection, thermal shutdown, etc.). The battery controller 714 can receive measurements 712 from sensors 710 and communicate with the charger 704 over a control channel such as the SMBUS 706. The battery controller 714 can also include stored information such as creation date of the battery, number of charge cycles, tables of cutoff thresholds, tables of charge state based on impedance, charge state equations, charge state equation constants, original OCV of the battery 702, original charge time of the battery 702, original impedance of the battery 702, etc.).

The charger 704 can include a charge controller 722, a power source 724 and a charger power interface 726. The charge controller 722 can receive messages over a control channel (such as the SMBUS 706 or I2C (inter-integrated circuit bus), etc.), configure the power source 724 (such as through commands 732) and receive measurements 730. The power source 724 can provide energy 728 to be delivered to and/or charge the battery 702. The power source 724 can be configured by the charge controller 722, including configurations such as constant current and/or constant voltage settings. The power source 724 can provide measurements 730 to the charge controller 722, such as voltage, current, impedance and power information including measurements and/or estimates. The power source 724 can receive input energy 720 (such as from an AC adapter or wall outlet) to convert into the energy 728 to charge the battery 702. The charger power interface 726 can couple the energy 728 from the power source 724 to the battery power interface 716. The charger 704 (such as the charger power interface 726, etc.) can include safety features (e.g., overvoltage, thermal and/or power protection).

The battery controller 714 can send messages that cause the charger 704 (by way of the charge controller 722) to perform actions. For example, the battery controller 714 can send a message using an SMBUS protocol to the charge controller 722 which causes the charge controller 722 to modify charging settings of the power source 724 that provides energy 718 to the battery 702 over the charger power interface 726 to the battery power interface 716 via a physical interface 708. The battery controller 714 can send messages to the charge controller 722 to request a constant current charge at a specified constant current value, a constant voltage charge at a specified constant voltage value, that charging stop at a specified cutoff current threshold, that charging stop at a specified voltage cutoff threshold, that charging stop at a specified cutoff impedance threshold, etc. In addition, the battery controller 714 can send messages to the charge controller 722 to enqueue a series of actions with specified thresholds to cause a transition from one action to another action in the queue. In other embodiments, the charge controller 722 can perform the same or similar tasks.

In some embodiments, the battery controller 714 can communicate with the charge controller 722 to cause a series of constant current step charges. The battery controller 714 can send a series of messages to the charge controller 722 to dynamically alter constant current step charges.

It should be recognized that FIG. 7 represents an embodiment, but that elements of the systems can be located and/or combined differently. For example, sensors 710 can be located in the charger 704 with measurements of the battery 702 occurring across the physical interface 708. Other combinations are also possible.

Depending on the embodiment, the charging instructions can reside in software, firmware and/or circuits of the charge controller. Embodiments described herein can also be integrated in systems on chips (SoCs) with integrated chargers, power management integrated circuits (PMICs) with integrated chargers, etc.

Figure 8:
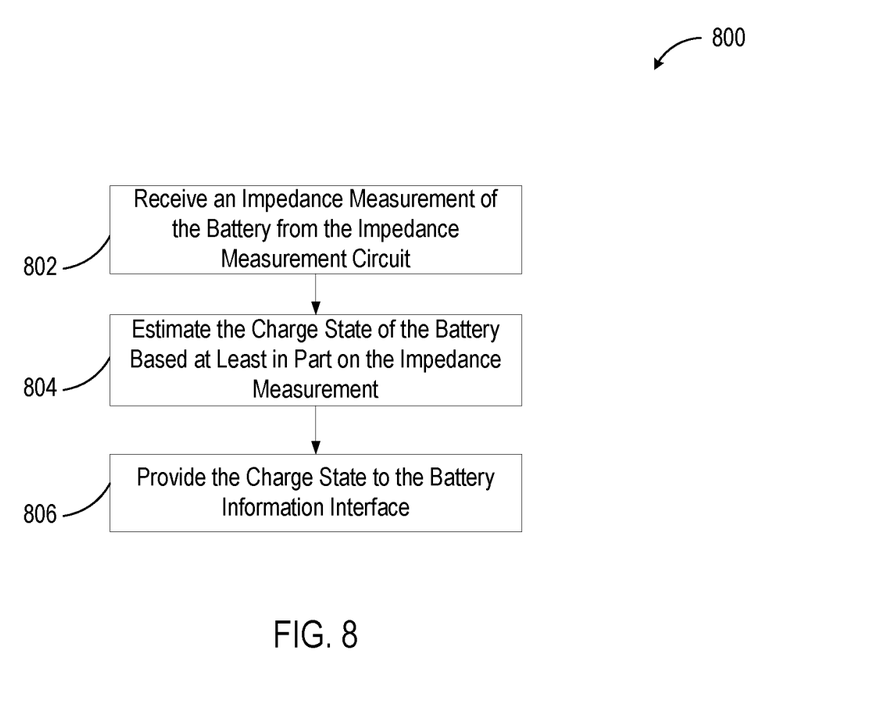
FIG. 8 is a flow chart illustrating a method for battery charge state detection consistent with embodiments disclosed herein.

FIG. 8 is a flow chart illustrating a method for battery charge state detection consistent with embodiments disclosed herein. The method can be accomplished by a system such as those shown in FIGS. 6-7, including the battery 702, sensors 710, fuel gauge IC 714, power management IC 722 and charger 704. In block 802, the fuel gauge IC receives an impedance measurement of the battery from the impedance measurement circuit. In block 804, the fuel gauge IC estimates the charge state of the battery based at least in part on the impedance measurement. In block 806, the fuel gauge IC provides the charge state to the battery information interface.

Figure 9:
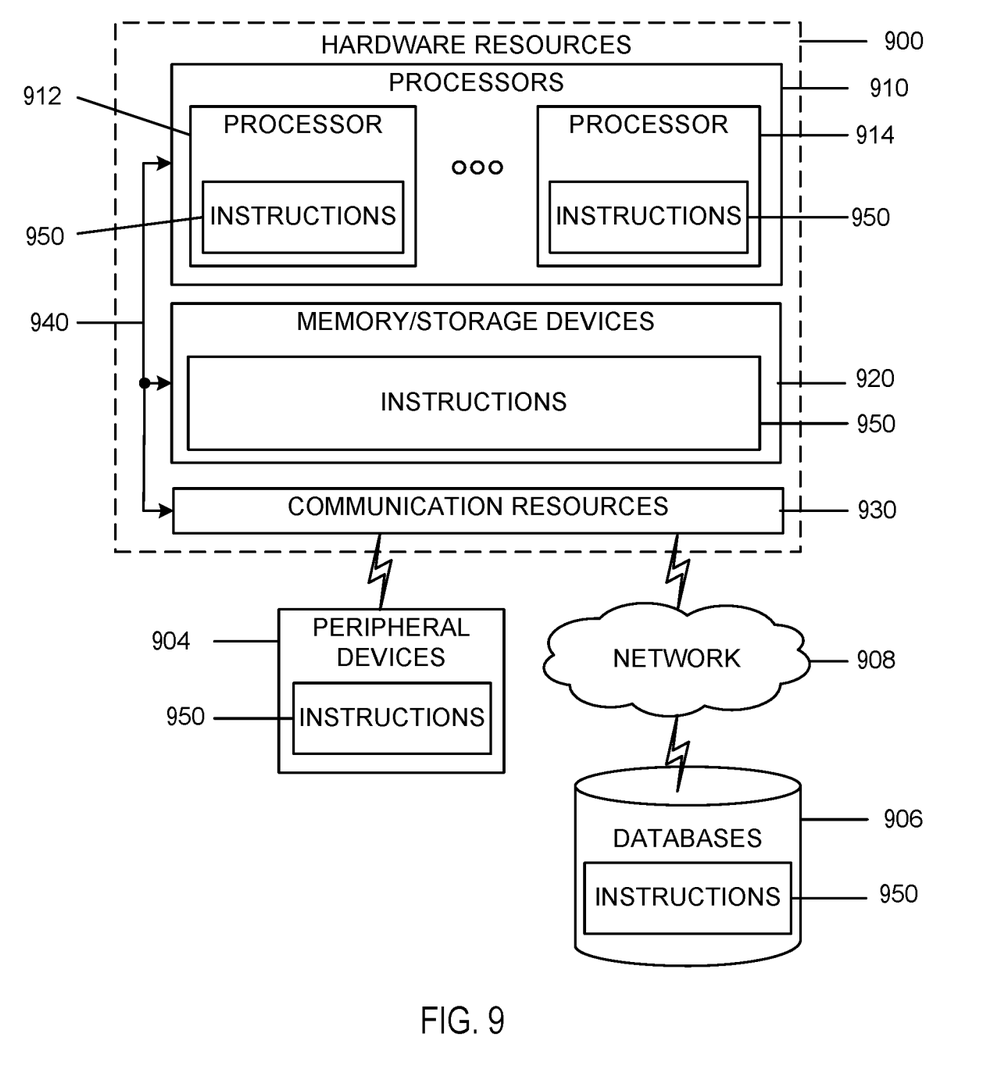
FIG. 9 is a diagram illustrating a computing system consistent with embodiments disclosed herein.

FIG. 9 is a block diagram illustrating components, according to some example embodiments, able to read instructions from a machine-readable or computer-readable medium (e.g., a machine-readable storage medium) and perform any one or more of the methodologies discussed herein. Specifically, FIG. 9 shows a diagrammatic representation of hardware resources 900 including one or more processors (or processor cores) 910, one or more memory/storage devices 920, and one or more communication resources 930, each of which are communicatively coupled via a bus 940.

The processors 910 (e.g., a central processing unit (CPU), a reduced instruction set computing (RISC) processor, a complex instruction set computing (CISC) processor, a graphics processing unit (GPU), a digital signal processor (DSP) such as a baseband processor, an application specific integrated circuit (ASIC), a radio-frequency integrated circuit (RFIC), another processor, or any suitable combination thereof) may include, for example, a processor 912 and a processor 914. The memory/storage devices 920 may include main memory, disk storage, or any suitable combination thereof.

The communication resources 930 may include interconnection and/or network interface components or other suitable devices to communicate with one or more peripheral devices 904 and/or one or more databases 906 via a network 908. For example, the communication resources 930 may include wired communication components (e.g., for coupling via a Universal Serial Bus (USB)), cellular communication components, Near Field Communication (NFC) components, Bluetooth® components (e.g., Bluetooth® Low Energy), Wi-Fi® components, and other communication components.

Instructions 950 may comprise software, a program, an application, an applet, an app, or other executable code for causing at least any of the processors 910 to perform any one or more of the methodologies discussed herein. The instructions 950 may reside, completely or partially, within at least one of the processors 910 (e.g., within the processor's cache memory), the memory/storage devices 920, or any suitable combination thereof. Furthermore, any portion of the instructions 950 may be transferred to the hardware resources 900 from any combination of the peripheral devices 904 and/or the databases 906. Accordingly, the memory of processors 910, the memory/storage devices 920, the peripheral devices 904, and the databases 906 are examples of computer-readable and machine-readable media.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

EXAMPLES

The following examples pertain to further embodiments.

Example 1 is a system for a battery fuel gauge for a battery. The system includes an impedance measurement circuit electrically coupled to the battery. The system also includes a battery information interface and a processor. The impedance measurement circuit electrically attached to the battery is designed to measure an impedance of the battery. The battery information interface is designed to provide an estimate of a charge state of the battery. The processor is designed to receive an impedance measurement of the battery from the impedance measurement circuit, estimate the charge state of the battery based at least in part on the impedance measurement, and provide the charge state to the battery information interface.

Example 2 is the subject matter of Example 1 or any of the Examples described herein, where to estimate the charge state of the battery also includes, when within a first charge state range, estimating the charge state of the battery based in part on the impedance measurement, and when within a second charge state range, estimating the charge state of the battery based in part on the open circuit voltage (OCV).

Example 3 is the subject matter of Example 1 or any of the Examples described herein, where the processor is further designed to periodically update the charge state to the fuel gauge interface based in part on a periodic measurement from the impedance measurement circuit.

In Example 4, the subject matter of Example 1 or any of the Examples described herein may further include storage for storing a look-up table used to estimate the charge state of the battery.

Example 5 is the subject matter of Example 1 or any of the Examples described herein where to estimate the charge state of the battery also includes a formula for estimation of the charge state of the battery, and where the formula uses the impedance measurement of the battery as an input and provides a percentage of charge as an output.

In Example 6, the subject matter of Examples 1-5 or any of the Examples described herein may further include where to estimate the charge state of the battery also includes compensation for temperature.

Example 7 is the subject matter of Example 6 or any of the Examples described herein where to compensate for temperature further includes calculating a difference of an actual impedance at a known charge state as compared to an expected impedance at the known charge state.

Example 8 is the subject matter of any of Examples 1-5 or any of the Examples described herein where estimating the charge state of the battery further includes compensating for age or cycles of the battery.

Example 9 is the subject matter of Example 8 or any of the Examples described herein where compensating for the age or the cycles of the battery also includes calculating a difference of actual impedance at a known charge state as compared to expected impedance at the known charge state.

Example 10 is the subject matter of any of Examples 1-5 or any of the Examples described herein where estimating the charge state of the battery also includes compensating for current load.

In Example 11, the subject matter of Example 10 or any of the Examples described herein where compensating for current load of the battery also includes calculating a difference of actual impedance at a known charge state as compared to expected impedance at the known charge state.

In Example 12, the subject matter of Example 1 or any of the Examples described herein may further include estimating an age or a number of cycles of the battery by calculating a difference of actual impedance at a known charge state as compared to expected impedance at the known charge state.

Example 13 is the subject matter of Example 1 or any of the Examples described herein where the processor is a power management integrated circuit (PMIC).

Example 14 is an apparatus of a power management system. The apparatus includes an interface, a battery charge state interface, and a processor. The interface is designed to receive impedance measurement information. The impedance measurement information is gathered from an impedance measurement circuit electrically linked to a battery and designed to measure an impedance of the battery. The battery charge state interface is designed to provide an estimate of a charge state of the battery. The processor is designed to receive the impedance measurement information of the battery using the interface, estimate the charge state of the battery based in part on the impedance measurement, and provide the charge state to the battery charge state interface.

Example 15 is the subject matter of Example 14 or any of the Examples described herein where the battery has a substantially flat-voltage profile between an 80 percent charge state and 20 percent charge state during charge or discharge.

Example 16 is the subject matter of Example 14 or any of the Examples described herein where the interface is designed to communicate with an operating system.

Example 17 is the subject matter of Example 14 or any of the Examples described herein where the battery is a Li-Air battery.

Example 18 is the subject matter of Example 14 or any of the Examples described herein where the battery is a Zinc-Air battery.

Example 19 is the subject matter of Examples 14-17 or any of the Examples described herein where the processor is a power management integrated circuit (PMIC).

Example 20 is the subject matter of any of Examples 14-17 or any of the Examples described herein where the battery impedance increases with a decrease in battery charge state.

Example 21 is the subject matter of Example 20 or any of the Examples described herein where to estimate the charge state of the battery also includes using the impedance as input to a formula to calculate charge state.

Example 22 is the subject matter of Example 20 or any of the Examples described herein where to estimate the charge state of the battery also includes using the impedance as a lookup in a table to calculate charge state.

Example 23 is the subject matter of Example 22 or any of the Examples described herein where to use the impedance as a lookup also includes using the impedance and temperature, current load, cycles or age as lookups in a table having multiple dimensions to calculate charge state.

Example 24 is the subject matter of Example 22 or any of the Examples described herein where the power management system is a system on a chip (SoC).

Example 25 is the subject matter of Example 22 or any of the Examples described herein where to estimate the charge state of the battery also includes, within a first charge state range, an estimate of the charge state of the battery based in part on the impedance measurement, and within a second charge state range, an estimate of the charge state of the battery based in part on the open circuit voltage (OCV).

Example 26 is the subject matter of Example 22 or any of the Examples described herein where the battery is a Li-Ion rechargeable battery with a Li-Metal anode.

Example 27 is a computer program product. The computer program product includes a computer-readable storage medium storing program code. The computer-readable storage medium storing program code causes one or more processors to perform a method. The method includes determining an impedance measurement of a battery that maintains a substantially constant voltage during discharge, calculating an estimate of a charge state of the battery based on the impedance, and generating a message that includes the estimate.

Example 28 is the subject matter of Example 27 or any of the Examples described herein where the substantially constant voltage is basically constant between an 80 percent charge state and 20 percent charge state during discharge.

Example 29 is the subject matter of Example 27 or any of the Examples described herein where to generate the message that includes the estimate also includes transmitting the message to an operating system to indicate an estimated percentage of charge of the battery.

Example 30 is the subject matter of Example 27 or any of the Examples described herein where the estimate of the charge state is a percentage of charge, an estimated battery discharge time remaining or amp-hours remaining.

Example 31 is a method. The method includes determining an impedance measurement of a battery that maintains a substantially constant voltage during discharge, calculating an estimate of a charge state of the battery based on the impedance, and generating a message that includes the estimate.

Example 32 is the subject matter of Example 31 or any of the Examples described herein where the substantially constant voltage is basically constant between an 80 percent charge state and 20 percent charge state during discharge.

Example 33 is the subject matter of Example 31 or any of the Examples described herein where to generate the message that includes the estimate also includes transmitting the message to an operating system to indicate an estimated percentage of charge of the battery.

Example 34 is the subject matter of Example 31 or any of the Examples described herein where the estimate of the charge state is a percentage of charge, an estimated battery discharge time remaining or amp-hours remaining.

Embodiments and implementations of the systems and methods described herein may include various operations, which may be embodied in machine-executable instructions to be executed by a computer system. A computer system may include one or more general-purpose or special-purpose computers (or other electronic devices). The computer system may include hardware components that include specific logic for performing the operations or may include a combination of hardware, software, and/or firmware.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and one or more clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smart phone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables, telephone lines, radio waves, satellites, microwave relays, modulated AC power lines, physical media transfer, and/or other data transmission "wires" known to those of skill in the art. The network may encompass smaller networks and/or be connectable to other networks through a gateway or similar mechanism.

Various techniques, or certain aspects or portions thereof, may take the form of program code (i.e., instructions) embodied in tangible media, such as floppy diskettes, CD-ROMs, hard drives, magnetic or optical cards, solid-state memory devices, a nontransitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and nonvolatile memory and/or storage elements), at least one input device, and at least one output device. The volatile and nonvolatile memory and/or storage elements may be a RAM, an EPROM, a flash drive, an optical drive, a magnetic hard drive, or other medium for storing electronic data. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

Each computer system includes one or more processors and/or memory; computer systems may also include various input devices and/or output devices. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, CD-ROM, DVD, disk, tape, or magnetic, optical, or other computer storage medium. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, or off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Several aspects of the embodiments described will be illustrated as software modules or components. As used herein, a software module or component may include any type of computer instruction or computer-executable code located within a memory device. A software module may, for instance, include one or more physical or logical blocks of computer instructions, which may be organized as a routine, program, object, component, data structure, etc., that perform one or more tasks or implement particular data types. It is appreciated that a software module may be implemented in hardware and/or firmware instead of or in addition to software. One or more of the functional modules described herein may be separated into sub-modules and/or combined into a single or smaller number of modules.

In certain embodiments, a particular software module may include disparate instructions stored in different locations of a memory device, different memory devices, or different computers, which together implement the described functionality of the module. Indeed, a module may include a single instruction or many instructions, and may be distributed over several different code segments, among different programs, and across several memory devices.

Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Reference throughout this specification to "an example" means that a particular feature, structure, or characteristic described in connection with the example is included in at least one embodiment of the present invention. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

It should be recognized that the systems described herein include descriptions of specific embodiments. These embodiments can be combined into single systems, partially combined into other systems, split into multiple systems or divided or combined in other ways. In addition, it is contemplated that parameters/attributes/aspects/etc. of one embodiment can be used in another embodiment. The parameters/attributes/aspects /etc. are merely described in one or more embodiments for clarity, and it is recognized that the parameters/attributes/aspects /etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

Those having skill in the art will appreciate that many changes may be made to the details of the above-described embodiments without departing from the underlying principles of the invention. The scope of the present invention should, therefore, be determined only by the following claims.

The invention claimed is:

1. A system for a battery fuel gauge for a battery comprising:
   an impedance measurement circuit electrically coupled to the battery and to measure an impedance of the battery;
   a battery information interface to provide an estimate of a charge state of the battery;
   a processor to:
     receive an impedance measurement of the battery from the impedance measurement circuit;
     when the impedance measurement of the battery is within a first range, estimate the charge state of the battery based at least in part on the impedance measurement;
     when the impedance measurement of the battery is within a second range, estimate the charge state of the battery based at least in part on an open circuit voltage (OCV); and
     provide the charge state to the battery information interface.

2. The system of claim 1, wherein the processor is to periodically update the charge state to the battery information interface based at least in part on a periodic measurement from the impedance measurement circuit.

3. The system of claim 1, further comprising storage to store a look-up table used to estimate the charge state of the battery.

4. The system of claim 1, wherein to estimate the charge state of the battery further comprises to use a formula for estimation of the charge state of the battery, wherein the formula uses the impedance measurement of the battery as an input and provides a percentage of charge as an output.

5. The system of claim 1, wherein to estimate the charge state of the battery further comprises to compensate for temperature.

6. The system claim 5, wherein to compensate for temperature further comprises to calculate a difference of an actual impedance at a known charge state as compared to an expected impedance at the known charge state.

7. The system of claim 1, wherein to estimate the charge state of the battery further comprises to compensate for current load.

8. The system of claim 7, wherein to compensate for current load of the battery further comprises to calculate a difference of an actual impedance at a known charge state as compared to an expected impedance at the known charge state.

9. The system of claim 1, wherein the processor is to calculate a difference of an actual impedance at a known charge state as compared to an expected impedance at the known charge state, to estimate an age or a number of cycles of the battery.

10. The system of claim 1, wherein the processor is a power management integrated circuit (PMIC).

11. An apparatus of a power management system, comprising:
    an interface to receive impedance measurement information, the impedance measurement information gathered from an impedance measurement circuit electrically coupled to a battery, wherein the impedance measurement circuit is to measure an impedance of the battery;

a battery charge state interface to provide an estimate of a charge state of the battery;
a processor to:
receive the impedance measurement information of the battery using the interface;
determine whether the battery is in a first charge state range or a second charge state range by comparison of a battery impedance of the impedance measurement information to a threshold;
estimate the charge state of the battery based at least in part on the impedance measurement if the battery is in the first charge state range;
estimate the charge state of the battery based at least in part on an open circuit voltage (OCV) if the battery is in the second charge state range; and
provide the charge state to the battery charge state interface.

12. The apparatus of claim 11, wherein the battery has a substantially flat-voltage profile between an 80 percent charge state and 20 percent charge state during charge or discharge.

13. The apparatus of claim 11, wherein the battery is a Li-Air battery.

14. The apparatus of claim 11, wherein the battery is a Zinc-Air battery.

15. The apparatus of claim 11, wherein the battery impedance increases with a decrease in battery charge state.

16. The apparatus of claim 15, wherein to estimate the charge state of the battery further comprises to use the impedance as input to a formula to calculate charge state.

17. The apparatus of claim 15, wherein to estimate the charge state of the battery further comprises to use the impedance as a lookup in a table to calculate charge state.

18. The apparatus of claim 17, wherein to use the impedance as a lookup further comprises to use the impedance and temperature, current load, cycles or age as lookups in a table having multiple dimensions to calculate charge state.

19. The apparatus of claim 17, wherein the battery is a Li-Ion rechargeable battery with a Li-Metal anode.

20. A non-transitory computer program product comprising a computer-readable storage medium storing program code for causing one or more processors to perform a method, the method comprising:
determining an impedance measurement of a battery that maintains a substantially constant voltage during discharge;
calculating an estimate of a charge state of the battery according to a charge state range and based on a one-to-one correspondence between the impedance measurement and the charge state of the battery and/or based at least in part on an open circuit voltage (OCV); and
generating a message that includes the estimate.

21. The non-transitory computer program product of claim 20, wherein the substantially constant voltage is substantially constant between an 80 percent charge state and 20 percent charge state during discharge.

22. The non-transitory computer program product of claim 20, wherein generating the message that includes the estimate further comprises transmitting the message to an operating system to indicate an estimated percentage of charge of the battery.

23. The non-transitory computer program product of claim 20, wherein the estimate of the charge state is a percentage of charge, an estimated battery discharge time remaining, or amp-hours remaining.

24. A battery apparatus comprising:
a battery;
a sensor coupled to the battery, the sensor to determine an impedance measurement of the battery that maintains a substantially constant voltage during discharge; and
a controller coupled to the sensor, wherein the controller is to:
calculate an estimate of a charge state of the battery based on a one-to-one correspondence between the impedance measurement and the charge state of the battery; and
generate a message that includes the estimate.

25. The battery apparatus of claim 24, wherein the controller is to calculate an estimate of a charge state of the battery according to a charge state range.

26. The battery apparatus of claim 24, wherein the controller is to calculate an estimate of a charge state of the battery based at least in part on an open circuit voltage (OCV).

27. The battery apparatus of claim 24, wherein the substantially constant voltage is substantially constant between an 80 percent charge state and 20 percent charge state during discharge.

28. The battery apparatus of claim 24, wherein to generate the message that includes the estimate further comprises the controller to send the message via an SMBUS protocol to an operating system to indicate an estimated percentage of charge of the battery.

29. The battery apparatus of claim 24, wherein the estimate of the charge state is a percentage of charge, an estimated battery discharge time remaining, or amp-hours remaining.

30. The battery apparatus of claim 24, wherein the battery is one of a Li-Air battery or a Zinc-Air battery.

31. The battery apparatus of claim 24, wherein the controller is to send a series of messages to a charge controller to dynamically alter constant current step charges.

* * * * *